(12) United States Patent
Peng et al.

(10) Patent No.: US 7,602,611 B2
(45) Date of Patent: Oct. 13, 2009

(54) REMOVABLE INTERFACE CARD EXPANSION MODULE

(75) Inventors: Ying-Chao Peng, Taipei (TW); Chun-Ying Yang, Taipei (TW)

(73) Assignee: Inventec Corporation, Taipei (TW)

( * ) Notice: Subject to any disclaimer, the term of this patent is extended or adjusted under 35 U.S.C. 154(b) by 276 days.

(21) Appl. No.: 11/699,697

(22) Filed: Jan. 30, 2007

(65) Prior Publication Data

US 2008/0183933 A1    Jul. 31, 2008

(51) Int. Cl.
*H05K 7/00* (2006.01)
(52) U.S. Cl. ...................... 361/728; 361/756
(58) Field of Classification Search ............. 361/600, 361/728–730, 732, 736, 747, 756, 752, 753, 361/748, 784, 796, 801, 683–684; 439/55, 439/76.1, 327, 377, 374, 625, 626, 629
See application file for complete search history.

(56) References Cited

U.S. PATENT DOCUMENTS

| | | | | |
|---|---|---|---|---|
| 5,905,885 A | * | 5/1999 | Richter et al. | 710/5 |
| 6,046,912 A | * | 4/2000 | Leman | 361/784 |
| 6,373,691 B1 | | 4/2002 | Chen | |
| 6,659,803 B1 | * | 12/2003 | Chen | 439/638 |
| 6,837,439 B2 | * | 1/2005 | Kitchen | 235/492 |
| 6,958,916 B2 | * | 10/2005 | Roesner et al. | 361/790 |
| 7,359,216 B2 | * | 4/2008 | Hall | 361/796 |

* cited by examiner

*Primary Examiner*—Hung S Bui
(74) *Attorney, Agent, or Firm*—Morris, Manning & Martin LLP; Tim Tinghang Xia

(57) ABSTRACT

A removable interface card expansion module slidably disposed in a case for the insertion of at least one interface card is provided. An opening is opened in the case, and a mainboard having at least one interface card slot corresponding to the interface card is disposed in the case. The removable interface card expansion module includes a removable frame, an expansion circuit board, and an interface adapter device. The removable frame slidably passes through the opening to be fixed in the case. The expansion circuit board is fixed in the removable frame, and includes at least one expansion slot for the insertion of the interface card. The interface adapter device is electrically connected to the expansion circuit board and the interface card slot of the mainboard, so as to electrically connect the interface card to the mainboard.

13 Claims, 9 Drawing Sheets

REMOVABLE INTERFACE CARD EXPANSION MODULE

BACKGROUND OF THE INVENTION

1. Field of Invention

The present invention relates to an expansion device of a computer peripheral interface card, and more particularly, to a removable interface card expansion module applied to computer devices.

2. Related Art

Currently, in order to facilitate a user to use peripheral devices, interface card slots of many different interfaces are arranged in a mainboard of a computer system for the insertion of interface cards of various computer peripheral input/output devices. Data transmission interfaces of the peripheral devices are diversified, for example, accelerated graphics port (AGP), peripheral component interconnect (PCI), or industry standard architecture (ISA). The interface cards inserted in the interface card slots can enhance the overall function of the computer and support specific peripheral devices, so as to meet different requirements on the computer system of the user.

In a common computer mainframe, various interface cards are perpendicular to the computer mainboard when inserted in various interface card slots of the mainboard, so the computer case is limited by the height of the interface cards, and thus cannot be made smaller or thinner. In addition, in another slot adapting manner, an adapter circuit board is perpendicularly disposed on the mainboard, expansion slots are arranged at one side edge of the adapter circuit board, and then interface cards are inserted in the expansion slots of the adapter circuit board. Thus, the interface cards can be mounted in parallel to the mainboard, and telecommunication can be established between the interface cards and the mainboard via the adapter circuit board, such that the computer case can be made thinner appropriately, and more interface cards are accommodated without the waste of space. However, the above manner still has certain disadvantages. If a plurality of interface cards is inserted in the adapter circuit board, as the interface cards stack on the adapter circuit board, and the space in the case is small, when a user needs to replace an interface card next to the mainboard, other interface cards have to be taken out to prevent unexpected damages to the nearby electronic elements before pulling out the innermost interface card, which is time-consuming and is quite inconvenient.

In view of the above, for example, an expansion module as disclosed in U.S. Pat. No. 6,373,691 is available at present, in which an adapter circuit board is fixed to an expansion module, and interface cards can be inserted in the adapter circuit board, so as to be fixed to the expansion module. The adapter circuit board has metal pins, and can be inserted into interface card slots of a mainboard, such that the interface cards can be electrically connected to the mainboard via the adapter circuit board, or can be fixed in a case via the expansion module. According to the above manner of adopting an expansion module, any one of the interface cards can be freely inserted in or pulled out without affecting other interface cards, and the entire expansion module is taken out of the case when inserting or pulling out the interface cards, thus being much more convenient in general.

Considering the disclosure of the above patent comprehensively, the connection between the interface cards and the mainboard is that the interface cards are directly inserted in the interface card slots of the mainboard with the metal pins, so as to electrically connect the interface cards to the mainboard. However, in the above connection manner, it is limited that the interface cards can only be directly mounted on, inserted into, or pulled out of the mainboard. As the mainboard is fixed in the computer case, when the user needs to replace the interface cards, the cover plate of the computer case has to be removed before carrying out the replacement, and again has to be mounted back and secured to the computer mainframe after the installation or replacement process. Moreover, the computer case is quite difficult to dismantle and secure as the computer case often does not match screws of the case, such that it is complicated and time-consuming to dismantle or install the interface cards.

SUMMARY OF THE INVENTION

In a conventional computer apparatus, no matter the interface cards are directly inserted in the mainboard, or are inserted in the mainboard after the case is mounted via an adapter device, the computer case has to be dismantled first when inserting or pulling out the interface cards, so the operation process is complicated and time-consuming. In view of the above, the present invention provides a removable interface card expansion module. By installing a draw-out expansion module in a computer case, interface cards can be replaced or inserted from outside the computer case. Thus, the operation time for replacing the interface cards is saved, and the operation process is simplified.

In order to achieve the aforementioned object, the present invention discloses a removable interface card expansion module, slidably disposed in a case, for the insertion of at least one interface card, wherein an opening is opened in the case, and a mainboard having at least one interface card slot corresponding to the interface card is disposed in the case. The removable interface card expansion module comprises a removable frame, an expansion circuit board, and an interface adapter device. The removable frame slidably passes through the opening to be fixed in the case, the expansion circuit board is fixed in the removable frame, and the expansion circuit board has at least one expansion slot for the insertion of the interface card. The interface adapter device is electrically connected to the expansion circuit board and the interface card slot of the mainboard, so as to electrically connect the interface card to the mainboard. Signals are adapted by the interface adapter device, and thus the removable frame can be drawn out of the case freely without being limited by the connection between the interface card and the interface card slot.

The present invention also provides a removable interface card expansion module, comprising a removable frame, an expansion circuit board, and an adapter circuit board. The removable frame slidably passes through an opening in the case to be fixed therein. The expansion circuit board is fixed to the removable frame. The expansion circuit board has at least one expansion slot for the insertion and fixing of the interface card, and has an expansion pin disposed at a side edge of the expansion circuit board, wherein the expansion pin is electrically connected to the expansion slot. The adapter circuit board is electrically connected to the interface card slot of the mainboard, and the adapter circuit board has an adapter slot, for the insertion of the expansion pin of the expansion circuit board, such that the expansion circuit board is electrically connected to the interface card slot of the mainboard, so as to electrically connect the interface card to the mainboard. Signals are adapted by the adapter circuit board, and thus the removable frame can be drawn out of the case freely without being limited by the connection between the interface card and the interface card slot.

The efficacy of the present invention is that the removable interface card expansion module can adapt electrical signals to the mainboard of a computer via the interface adapter device or the adapter circuit board, so as to alter the connection between the interface card and the interface card slot. In addition, the removable interface card expansion module can be drawn out of the case like a drawer, and the user can replace various interface cards from outside the case directly without carrying out a complicated dismounting/mounting process to the cover plate of the case, such that the process to replace the interface cards is simplified, the time for installation is saved, and the overall efficiency in application is improved.

The detailed features and advantages of the present invention will be described in detail in the following embodiments. Those skilled in the arts can easily understand and implementation the content of the present invention. Furthermore, the relative objectives and advantages of the present invention are apparent to those skilled in the arts with reference to the content disclosed in the specification, claims, and drawings.

The above description of the content of the present invention and the following illustration of the embodiments are intended to demonstrate and explain the principle of the present invention and to provide further explanations of the claims of the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below for illustration only, and thus is not limitative of the present invention, and wherein.

DETAILED DESCRIPTION OF THE INVENTION

In order to make the objective, structure, features, and function of the present invention comprehensible, preferred embodiments accompanied with figures are described in detail below.

Figure 1:
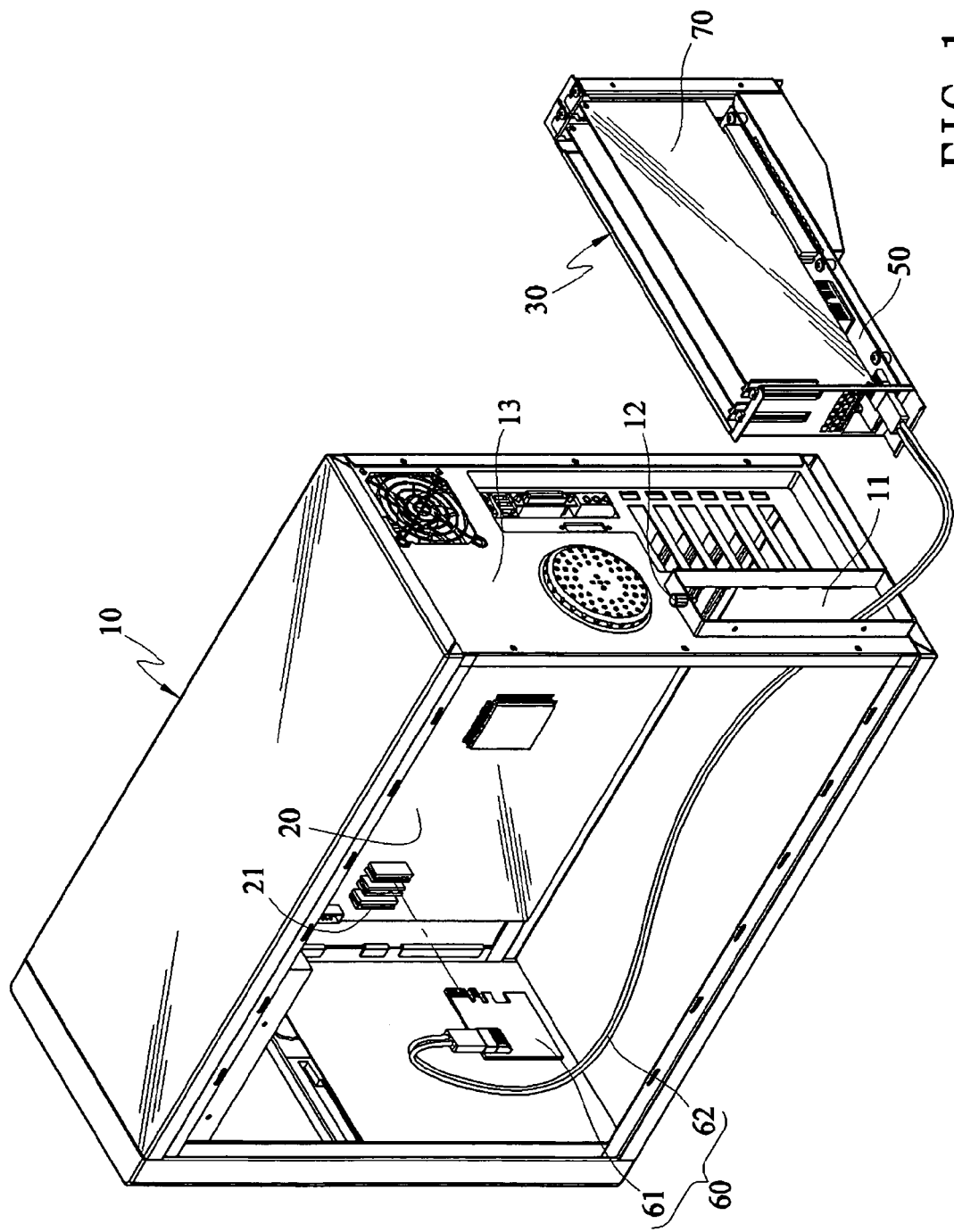
FIG. 1 is an exploded stereogram of an expansion module disposed in a computer case according to a first embodiment of the removable interface card expansion module of the present invention.
Figure 2:
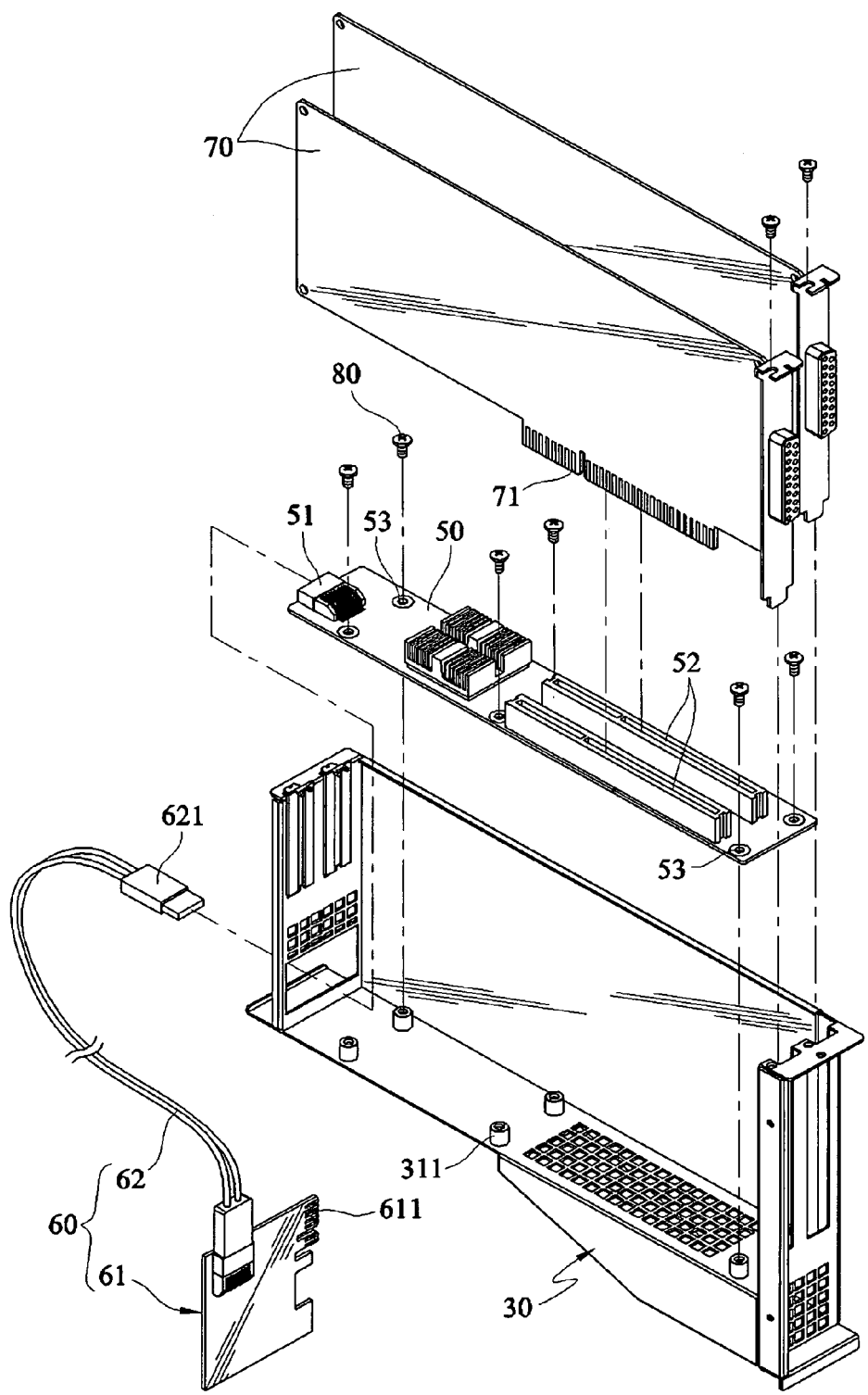
FIG. 2 is an exploded stereogram of the first embodiment of the removable interface card expansion module according to the present invention.
Figure 3:
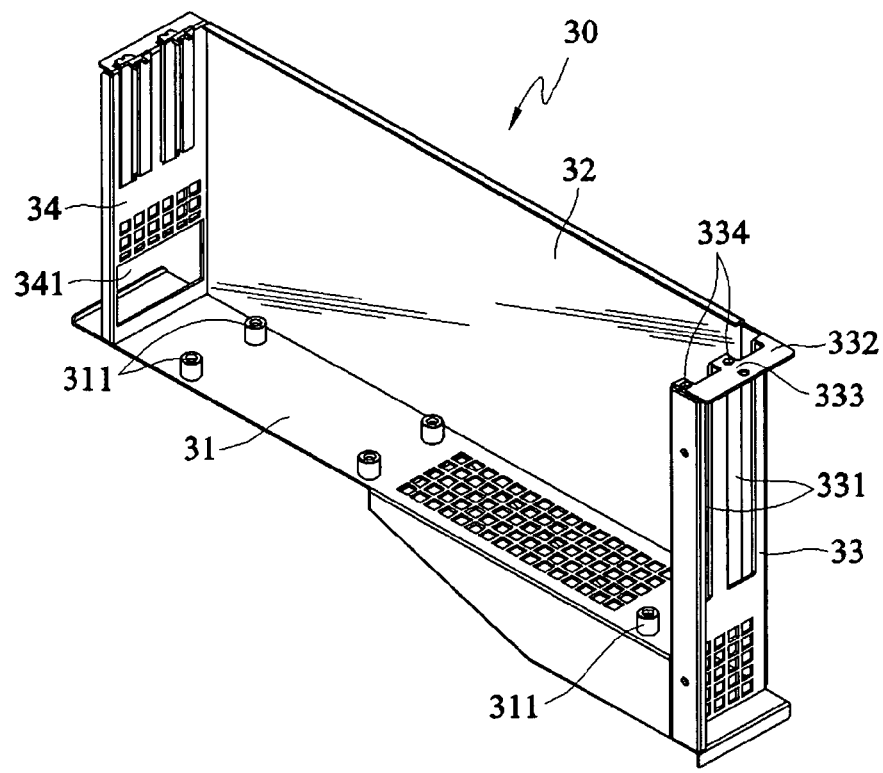
FIG. 3 is a schematic stereogram of a removable frame in the first embodiment of the removable interface card expansion module according to the present invention.
Figure 4:
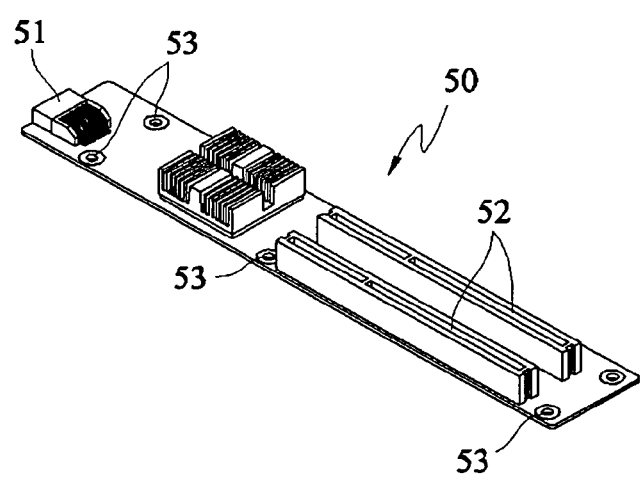
FIG. 4 is a schematic stereogram of an expansion circuit board in the first embodiment of the removable interface card expansion module according to the present invention.
Figure 5:
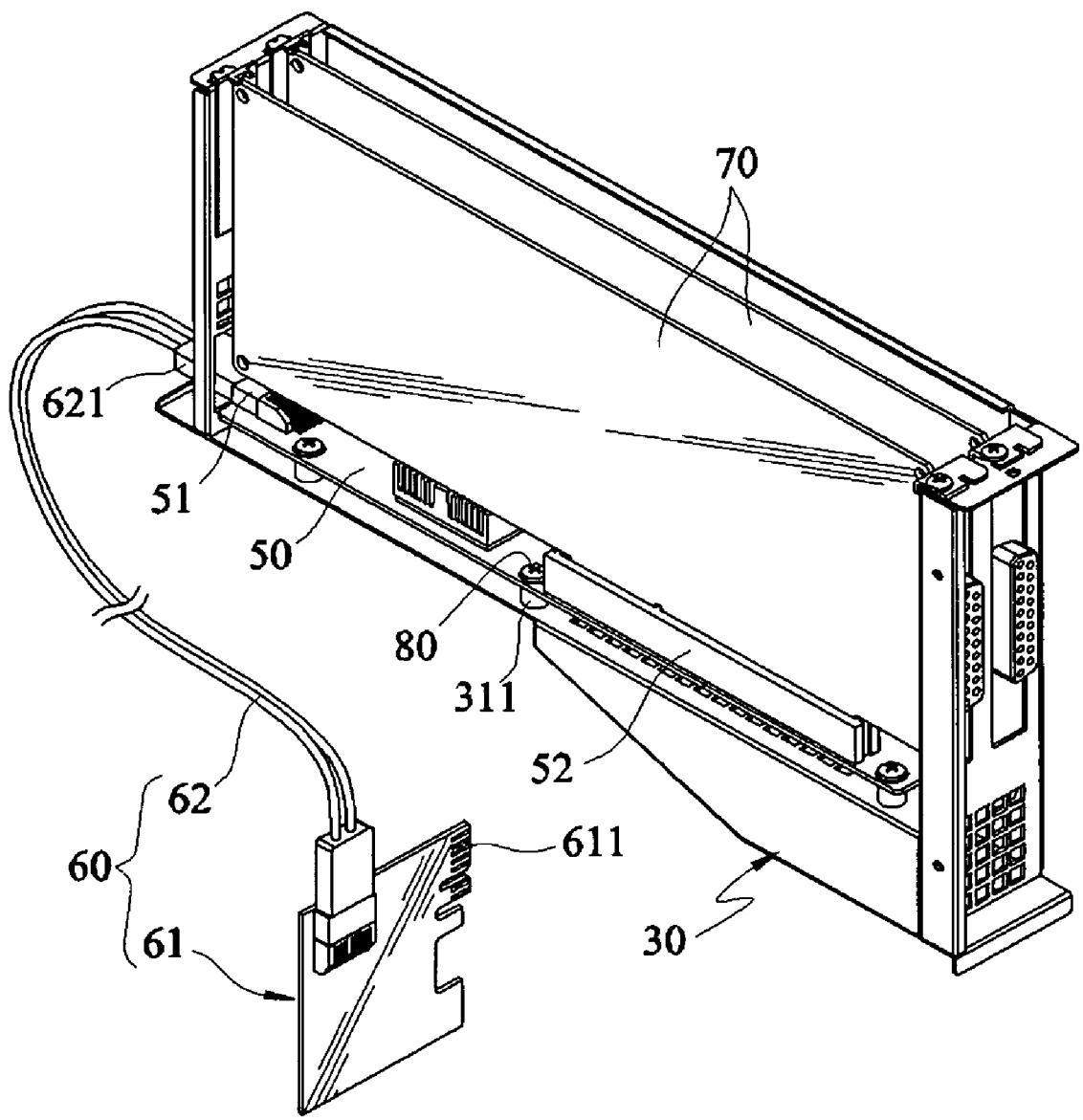
FIG. 5 is a schematic stereogram of the first embodiment of the removable interface card expansion module according to the present invention.
Figure 6:
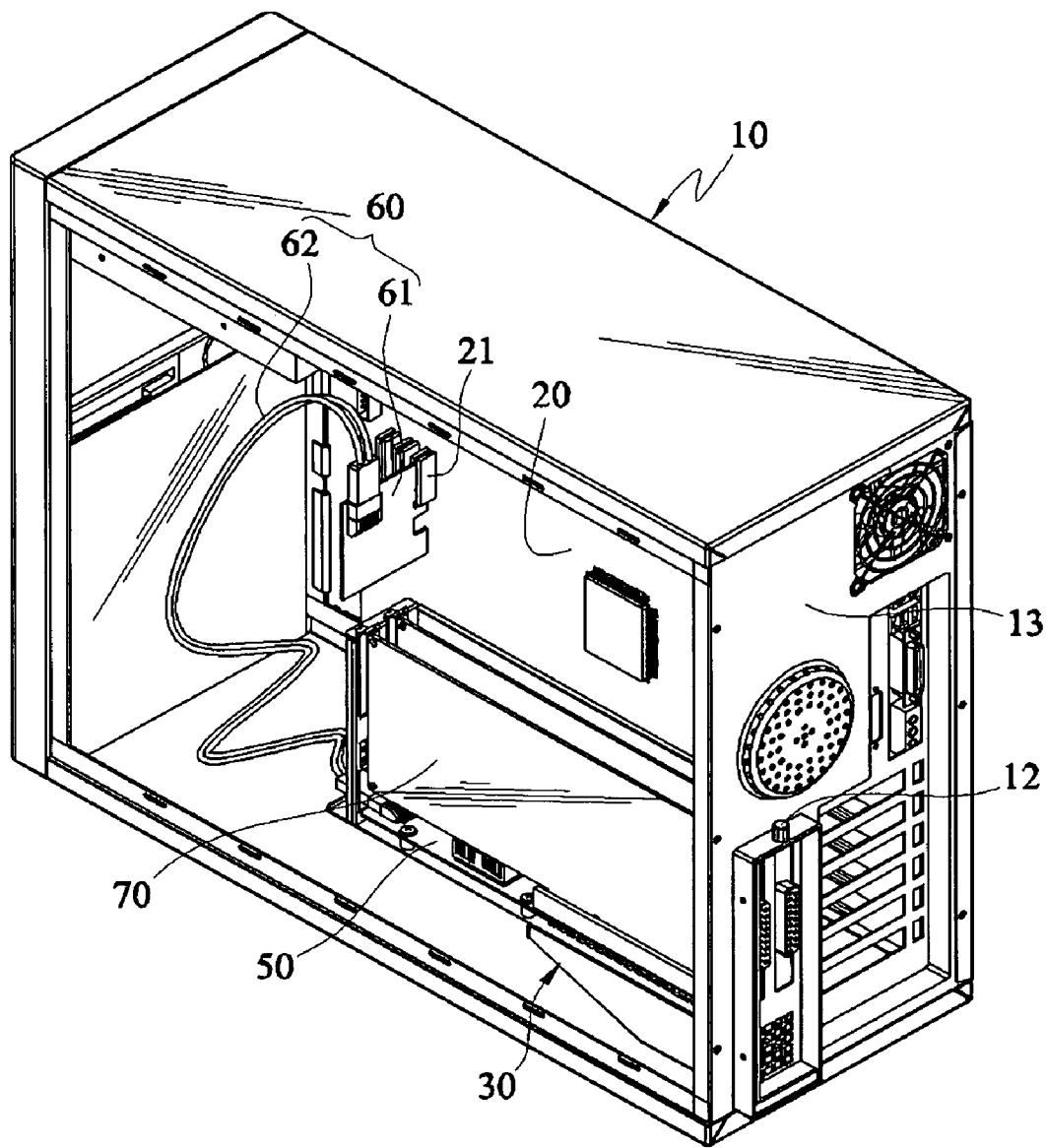
FIG. 6 is a schematic stereogram of an expansion module disposed in a computer case according to the first embodiment of the removable interface card expansion module of the present invention.

FIGS. 1, 2, 3, 4, 5, and 6 show a removable interface card expansion module according to a first embodiment of the present invention, which includes a removable frame 30, an expansion circuit board 50, and an interface adapter device 60. The removable interface card expansion module is slidably disposed in a case 10, for the insertion and fixing of at least one interface card 70, so as to electrically connect the interface card 70 to a mainboard 20 to facilitate the electrical signal transmission between the interface card 70 and the mainboard 20.

The case 10 is of a frame structure, which is hollow to accommodate electronic elements of a computer system. An opening 11 is formed in a rear side plate 13 of the case 10, so as to connect the interior and the exterior of the case 10. A screwing member 12 (e.g., a thumb screw) is disposed near a side edge of the opening 11 in the rear side plate 13. The mainboard 20 is fixed in the case 10, and has one or more interface card slots 21 corresponding to the interface card 70.

The expansion circuit board 50 is fixed in the removable frame 30, and includes a bus socket 51, two expansion slots 52, and a plurality of fixing holes 53. Each of the expansion slots 52 is used for the insertion and fixing of pins 71 of the interface card 70, wherein the number of the expansion slots 52 is not limited herein, and can be increased or reduced according to actual demands. The bus socket 51 is disposed at a side edge of the expansion circuit board 50, and is electrically connected to various expansion slots 52 via the circuit on the expansion circuit board 50, such that the electrical signals are output from or input into the expansion circuit board 50 via the bus socket 51, and are transmitted to various interface cards 70 via the expansion circuit board 50. The number of the fixing holes 53 can be, but not limited to, six, which can also be increased or reduced according to actual demands.

The removable frame 30 slidably passes through the opening 11 to be fixed in the case 10, and includes a base plate 31, a first side plate 32, and a second side plate 33. The base plate 31 carries the expansion circuit board 50, and a plurality of threaded hole posts 311 is disposed on the surface of the base plate 31. The threaded hole posts 311 are corresponding to the fixing holes 53 of the expansion circuit board 50, and the number of the threaded hole posts 311 is designed to be the same as the number of the fixing holes 53, such that screws 80 pass through the fixing holes 53 to be screwed to the threaded hole posts 311, thereby fixing the expansion circuit board 50 on the base plate 31. A long side edge of the base plate 31 extends upward to form the first side plate 32.

A short side edge of the base plate 31 extends upward to form the second side plate 33, and a side edge of the second side plate 33 is connected with the first side plate 32. The second side plate 33 has two slots 331, an outward plate 332, and two threaded holes 334. The number and geometrical relationship of the slots 331 are corresponding to those of the expansion slots 52. Thus, a side of various interface cards 70 can be inserted in the slots 331, and the side is exposed outside the removable frame 30 and the case 10. The number of the threaded holes 334 is the same as that of the slots 331, and the threaded holes 334 are arranged at a side edge of the slots 331. Thus, the screws 80 of various interface cards 70 can be screwed in the threaded holes 334, so as to fix the interface cards 70 to the removable frame 30. The top of the second side plate 33 extends outward to form the outward plate 332, and a fixing hole 333 corresponding to a screwing member 12 (e.g., a thumb screw) is opened in the outward plate 332. Thus, the screwing member 12 passes through the fixing hole 333 to fix the removable frame 30 to the opening 11 of the case 10.

The other short side edge of the base plate 31 extends upward to form a third side plate 34, and a side edge of the third side plate 34 is connected to the first side plate 32. The third side plate 34 has a notch 341, and the bus socket 51 of the expansion circuit board 50 is disposed in the notch 341.

The interface adapter device 60 is disposed in the case 10, and has a bus cable 62 and an adapter card 61. A cable connector 621 is disposed at an end of the bus cable 62, which can be inserted in and connected to the bus socket 51 of the expansion circuit board 50 through the notch 342. The adapter card 61 has an adapter pin 611, which can be inserted in the interface card slot 21 of the mainboard 20. The bus cable 62 is electrically connected to the adapter card 61, so as to electrically connect the expansion circuit board 50 to the mainboard 20, such that the electrical signals of the mainboard 20 can be output to the expansion circuit board 50 via the adapter card 61 and the bus cable 62.

Therefore, according to the first embodiment, after the interface cards 70 are inserted in the expansion slots 52 of the expansion circuit board 50, the electrical signals can be transmitted to the mainboard 20 via the expansion circuit board 50, the bus cable 62, and the adapter card 61 sequentially. Thus, the arrangement of the interface cards 70 and the mainboard 20 is not limited by the position of the interface card slot 21. As such, without using any tool, the user can easily screw out the screwing member 12, draw out the removable frame 30 from the case 10 through the opening 11, so as to directly insert the interface cards in the expansion circuit board 50, firmly fix the interface cards 70 to the removable frame 30 with the screws 80, and then push the removable frame 30 into the case 10 through the opening 11 to be fixed by the screwing member 12. Thus, the process to expand peripheral devices of a computer system is completed in a simple way.

Figure 7:
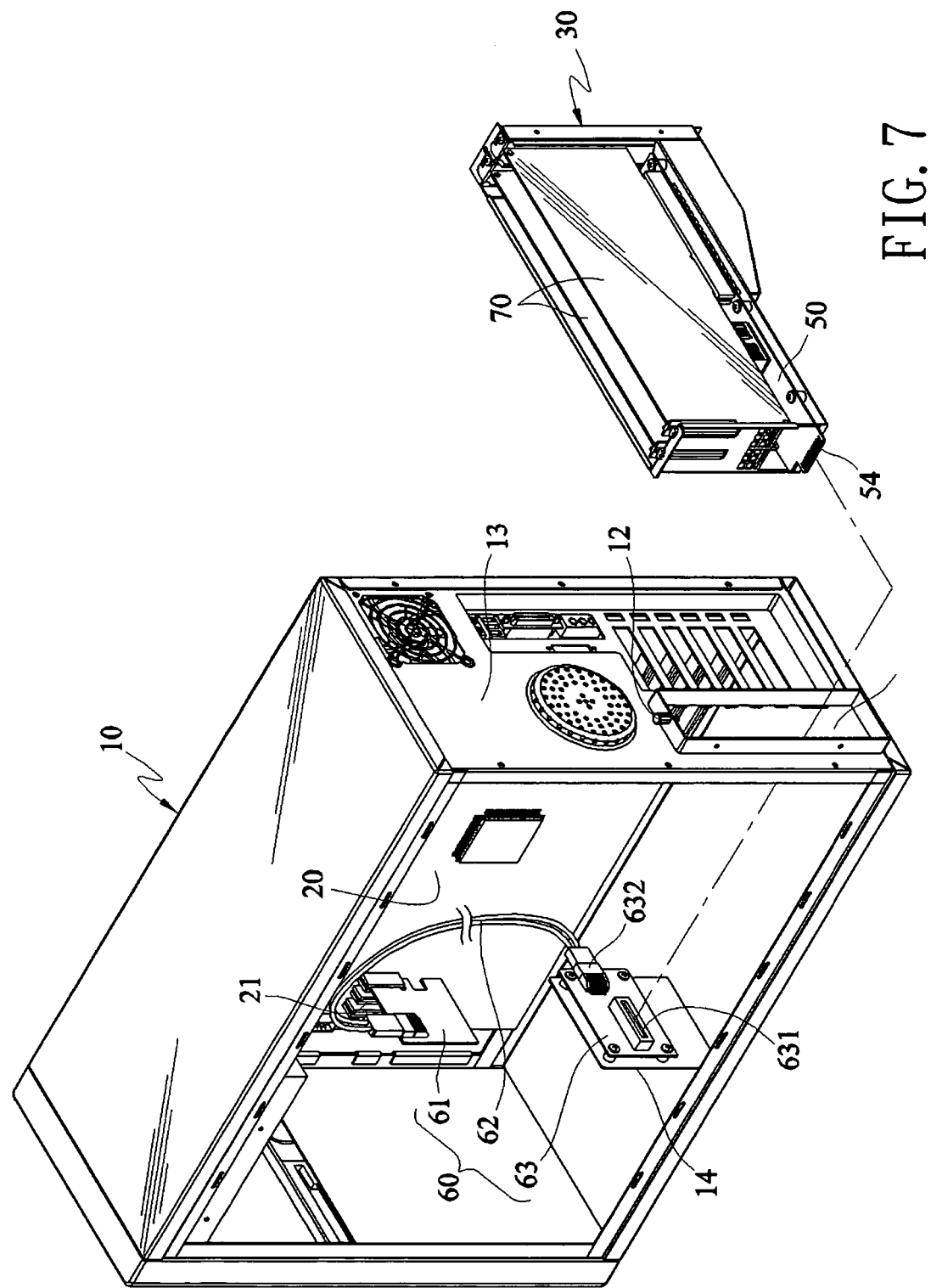
FIG. 7 is an exploded stereogram of an expansion module disposed in a computer case according to a second embodiment of the removable interface card expansion module of the present invention.
Figure 8:
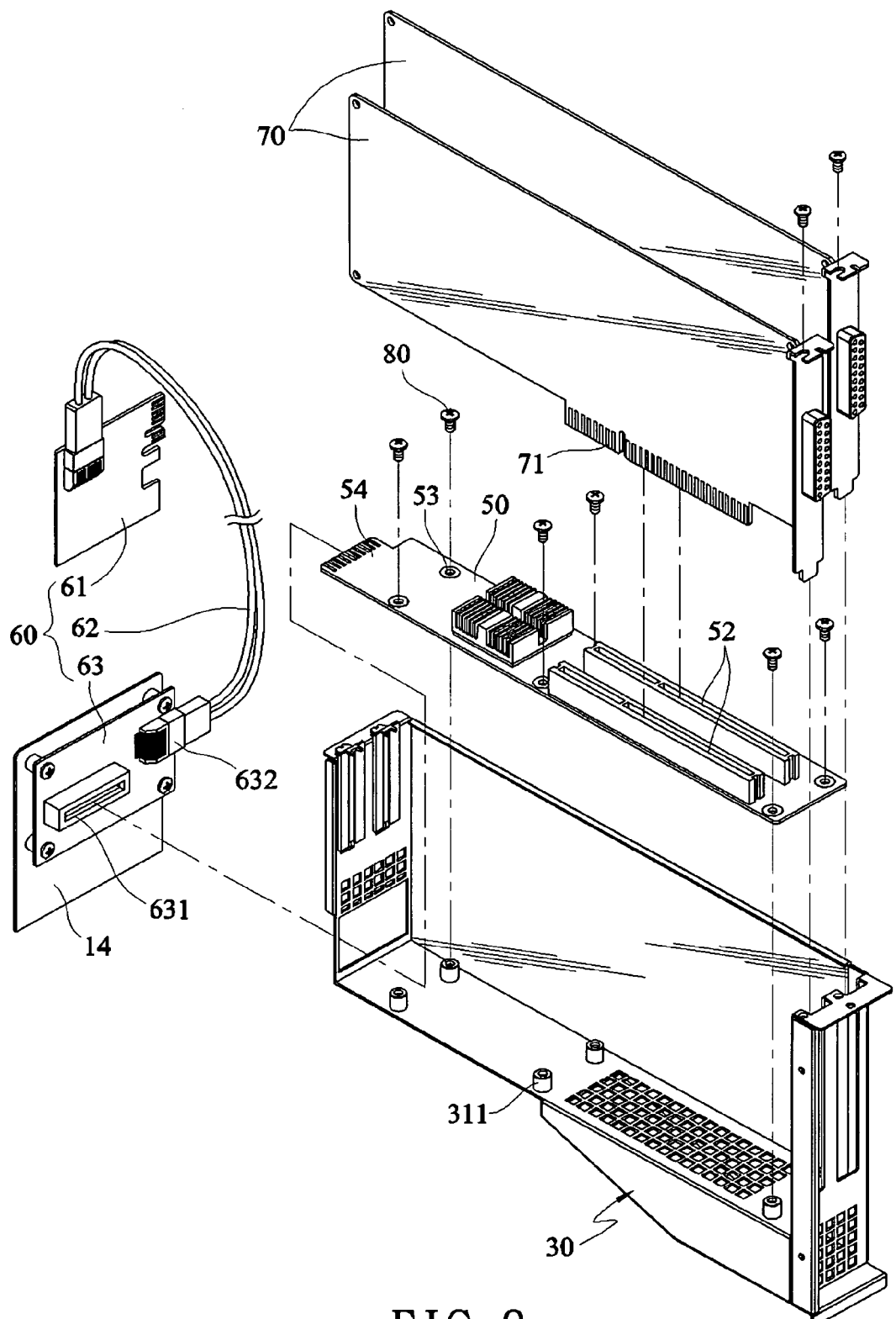
FIG. 8 is an exploded stereogram of the second embodiment of the removable interface card expansion module according to the present invention.
Figure 9:
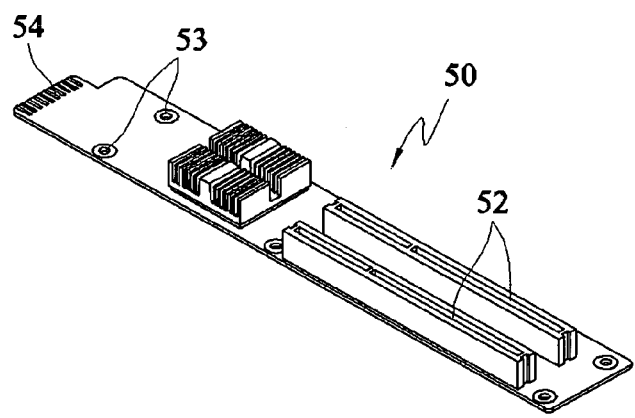
FIG. 9 is a schematic stereogram of an expansion circuit board in the second embodiment of the removable interface card expansion module according to the present invention.
Figure 10:
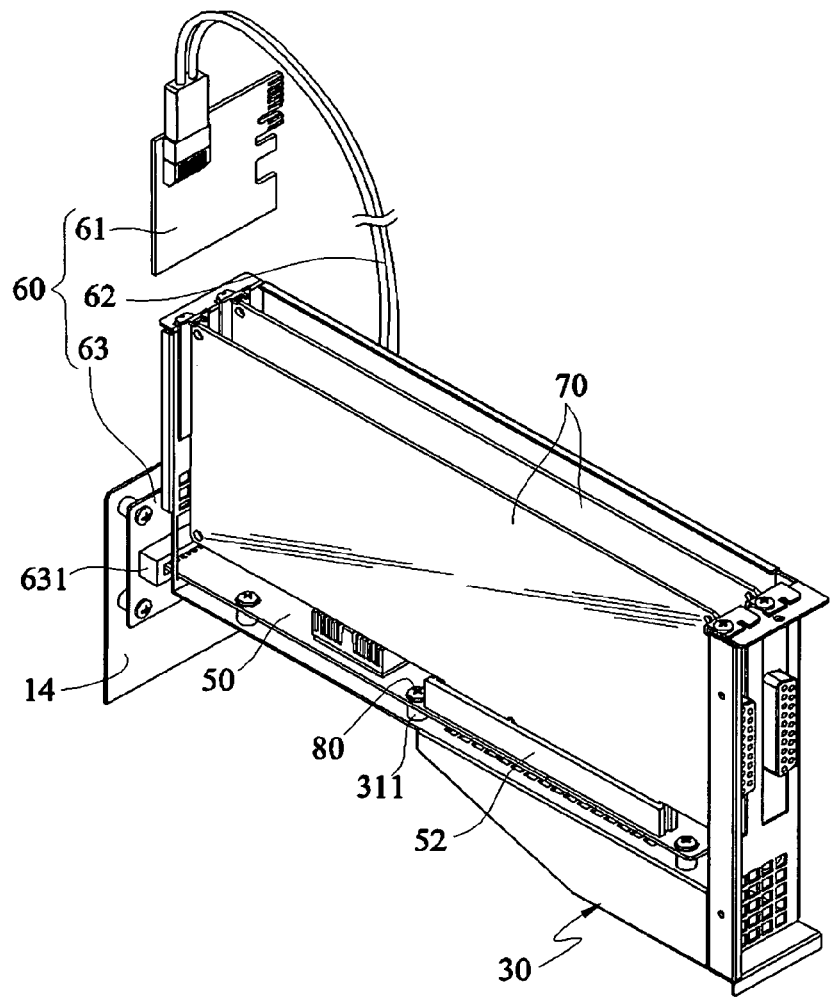
FIG. 10 is a schematic stereogram of the second embodiment of the removable interface card expansion module according to the present invention.
Figure 11:
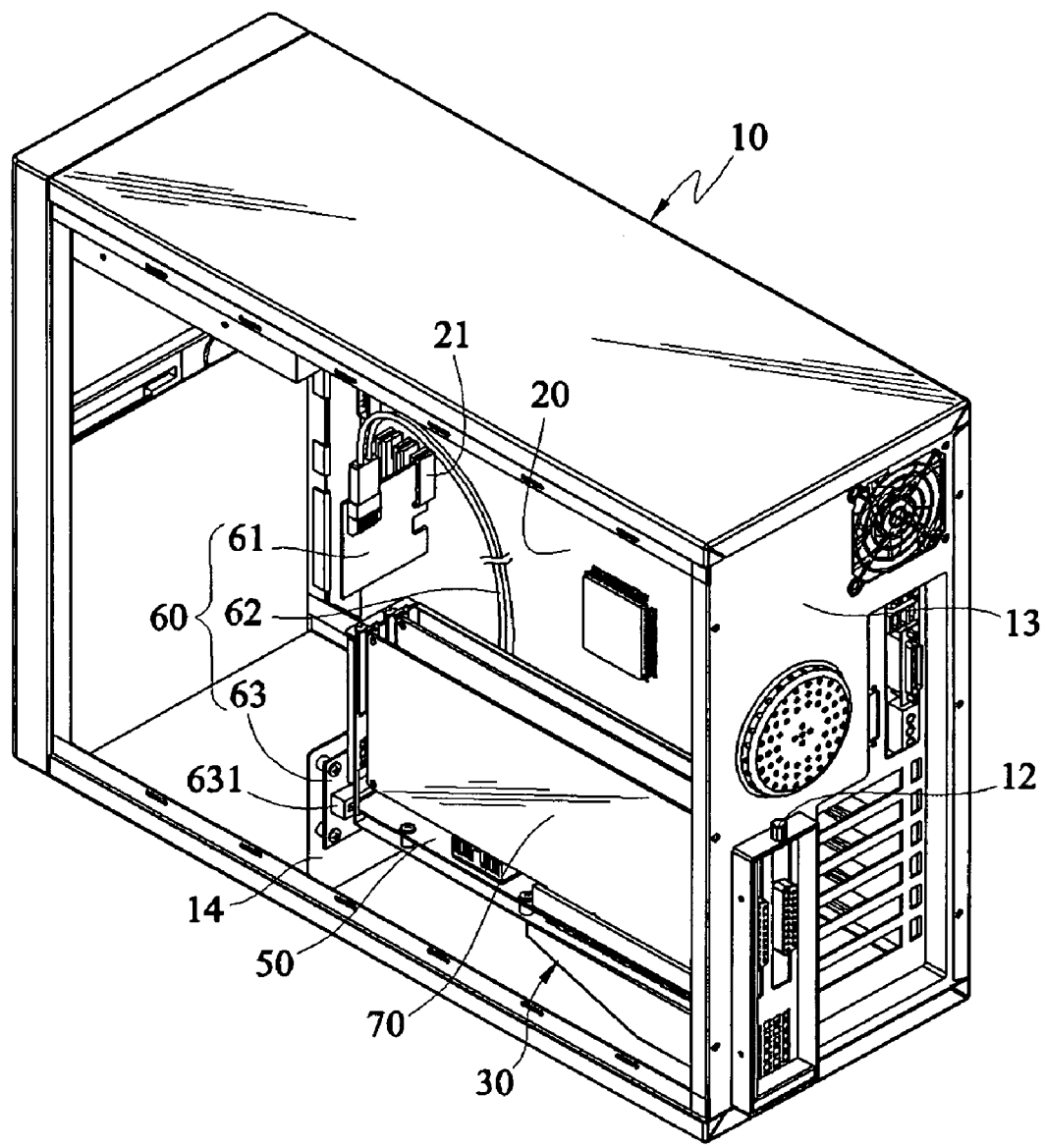
FIG. 11 is a schematic stereogram of an expansion module disposed in a computer case according to the second embodiment of the removable interface card expansion module of the present invention.

FIGS. 7, 8, 9, 10, and 11 show a second embodiment of the removable interface card expansion module of the present invention, which includes similar components as the first embodiment. However, the main difference between the two embodiments is that the removable interface card expansion module of this embodiment includes a removable frame 30, an expansion circuit board 50, an adapter circuit board 63, a bus cable 62, and an adapter card 61.

A fixing frame 14 is installed in the case 10, and the adapter circuit board 63 of this embodiment is fixed on the fixing frame 14. The adapter circuit board 63 includes an adapter slot 631 and an adapter bus 632. An expansion pin 54 is formed on a side of the expansion circuit board 50, and is electrically connected to the expansion slots 52. The expansion pin 54 is corresponding to the adapter slot 631 of the adapter circuit board 63. After the expansion circuit board 50 is pushed into the case 10, the expansion pin 54 can be inserted and fixed in the adapter slot 631 of the adapter circuit board 63 through the notch 341, so as to electrically connect the interface cards 70 to the adapter circuit board 63.

The cable connector 621 at the end of the bus cable 62 is inserted in and connected to the adapter bus 632 of the adapter circuit board 63, and the adapter pin 611 of the adapter card 61 can be inserted in the interface card slot 21 of the mainboard 20, such that the bus cable 62 is electrically connected between the adapter circuit board 63 and the adapter card 61, thereby electrically connecting the expansion circuit board 50 to the mainboard 20. Thus, the electrical signals of the mainboard 20 can be output to the expansion circuit board 50 via the adapter card 61, the bus cable 62, and the adapter circuit board 63 sequentially, and then transmitted to the interface cards 70 inserted on the expansion circuit board 50.

To sum up, in the removable interface card expansion module disclosed in the above two embodiments, as the connection between the interface cards 70 and the interface card slots 21 changes, and the removable frame 30 and the case 10 are properly arranged, the removable frame 30 can be drawn out of or pushed in and fixed to the case 10 with bare hands, and thus the interface cards 70 can be replaced directly from outside the case 10. As such, it is unnecessary to dismantled and mount the cover plate of the case 10, and the process to replace the interface cards 70 is effectively simplified, which is helpful for the user to expand peripheral devices of a computer system, and saves the operation time to improve the working efficiency.

Though the present invention has been disclosed above by the embodiments, they are not intended to limit the present invention. Any modifications and variations made within the spirit and scope of the present invention fall in the protecting range thereof. In addition, the protecting range of the present invention can refer to the appended claims.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A removable interface card expansion module, slidably disposed in a case, for insertion of at least one interface card, wherein an opening is opened in the case, and a mainboard having at least one interface card slot corresponding to the interface card is disposed in the case, the removable interface card expansion module comprising:
   a removable frame, slidably passing through the opening to be fixed in the case;
   an expansion circuit board, fixed in the removable frame, and having at least one expansion slot for the insertion of the interface card; and
   an interface adapter device, electrically connected to the expansion circuit board and the interface card slot of the mainboard, for electrically connecting the interface card to the mainboard.

2. The removable interface card expansion module as claimed in claim 1, wherein the interface adapter device comprises a bus cable and an adapter card, the adapter card is electrically connected to the interface card slot of the mainboard, and the bus cable is electrically connected to the adapter card and the expansion circuit board.

3. The removable interface card expansion module as claimed in claim 2, wherein a bus socket is disposed at a side edge of the expansion circuit board, the bus socket is electrically connected to the expansion slot, and an end of the bus cable is inserted in the bus socket.

4. The removable interface card expansion module as claimed in claim 2, wherein the adapter card has an adapter pin inserted in the interface card slot of the mainboard, so as to be electrically connected to the mainboard.

5. The removable interface card expansion module as claimed in claim 1, wherein the removable frame further comprises a base plate to which the expansion circuit board is fixed, and a first side plate extending upward from a long side edge of the base plate.

6. A removable interface card expansion module, slidably disposed in a case, for insertion of at least one interface card, wherein an opening is opened in the case, and a mainboard having at least one interface card slot corresponding to the interface card is disposed in the case, the removable interface card expansion module comprising:
- a removable frame, slidably passing through the opening to be fixed in the case;
- an expansion circuit board, fixed in the removable frame, and having at least one expansion slot for the insertion of the interface card; and
- an interface adapter device, electrically connected to the expansion circuit board and the interface card slot of the mainboard, for electrically connecting the interface card to the mainboard,
- wherein the removable frame comprises a base plate to which the expansion circuit board is fixed, and a first side plate extending upward from a long side edge of the base plate, and wherein a short side edge of the base plate extends upward to form a second side plate, and a side of the second side plate is connected to the first side plate; the second side plate has at least one slot corresponding to the expansion slot of the expansion circuit board, and a side of the interface card is thus inserted in the slot and exposed outside the removable frame.

7. The removable interface card expansion module as claimed in claim 6, wherein the second side plate has a fixing hole, allowing a screwing member to pass through to fix the removable frame to the case.

8. A removable interface card expansion module, slidably disposed in a case, for insertion and fixing of at least one interface card, wherein an opening is opened in the case, and a mainboard having at least one interface card slot corresponding to the interface card is disposed in the case, the removable interface card expansion module comprising:
- a removable frame, slidably passing through the opening to be fixed in the case;
- an expansion circuit board, fixed to the removable frame, wherein the expansion circuit board has at least one expansion slot for the insertion of the interface card and an expansion pin disposed at a side edge of the expansion circuit board, and the expansion pin is electrically connected to the expansion slot; and
- an adapter circuit board, electrically connected to the interface card slot of the mainboard, wherein the adapter circuit board has an adapter slot for the insertion of the expansion pin of the expansion circuit board, such that the expansion circuit board is electrically connected to the interface card slot of the mainboard, so as to electrically connect the interface card to the mainboard.

9. The removable interface card expansion module as claimed in claim 8, further comprising a bus cable and an adapter card, wherein the adapter card is electrically connected to the interface card slot of the mainboard, and the bus cable is electrically connected to the adapter circuit board and the adapter card.

10. The removable interface card expansion module as claimed in claim 9, wherein the adapter card has an adapter pin inserted in the interface card slot of the mainboard, so as to be electrically connected to the mainboard.

11. The removable interface card expansion module as claimed in claim 8, wherein the removable frame further comprises a base plate to which the expansion circuit board is fixed, and a first side plate extending upward from a long side edge of the base plate.

12. The removable interface card expansion module as claimed in claim 11, wherein a short side edge of the base plate extends upward to form a second side plate, and a side of the second side plate is connected to the first side plate; the second side plate has at least one slot corresponding to the expansion slot of the expansion circuit board, and a side of the interface card is inserted in the slot and exposed outside the removable frame.

13. The removable interface card expansion module as claimed in claim 12, wherein the second side plate has a fixing hole, allowing a screwing member to pass through to fix the removable frame to the case.

* * * * *